United States Patent
Yoo et al.

(10) Patent No.: US 6,878,575 B2
(45) Date of Patent: Apr. 12, 2005

(54) METHOD OF FORMING GATE OXIDE LAYER IN SEMICONDUCTOR DEVICES

(75) Inventors: Jae-Yoon Yoo, Seoul (KR); Moon-Han Park, Yongin (KR); Byou-Ree Lim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/727,125

(22) Filed: Dec. 3, 2003

(65) Prior Publication Data

US 2004/0110325 A1 Jun. 10, 2004

(30) Foreign Application Priority Data

Dec. 3, 2002 (KR) .................. 10-2002-0076230

(51) Int. Cl.⁷ .......................... H01L 21/335
(52) U.S. Cl. .................. 438/142; 134/2; 134/3
(58) Field of Search .................. 438/142; 134/2–3

(56) References Cited

U.S. PATENT DOCUMENTS

| | | | |
|---|---|---|---|
| 5,509,970 A | * 4/1996 | Shiramizu ................. 134/3 |
| 6,008,128 A | 12/1999 | Habuka et al. ............ 438/695 |
| 6,124,218 A | 9/2000 | Hwang ...................... 438/788 |
| 6,127,282 A | * 10/2000 | Lopatin ..................... 438/754 |
| 6,391,796 B1 | 5/2002 | Akiyama et al. .......... 438/763 |
| 2002/0036324 A1 | 3/2002 | Houston et al. ............ 257/359 |

* cited by examiner

Primary Examiner—Luan Thai
(74) Attorney, Agent, or Firm—Mills & Onello LLP

(57) ABSTRACT

Methods of preparing improved semiconductor substrates having gate oxide layers formed thereon, and use of such substrates in fabricating improved semiconductor devices, are disclosed. The methods include a first step of performing a cleaning process for removing a natural oxide layer formed on a semiconductor substrate and also for removing an oxide layer generated by the removal of the natural oxide layer; a second step of executing a hydrogen annealing process to form a hydrogen passivation layer and for further reducing a surface roughness of the semiconductor substrate completed in the cleaning process; a third step of forming a gate oxide layer thereon; a fourth step of performing a nitridation process on the gate oxide layer to prevent the semiconductor substrate from a permeation of ions during a subsequent gate electrode formation step; and, a fifth step of performing a subsequent thermal process to stabilize a surface of the gate oxide layer, thereby improving a defect rate of the device caused in forming the gate oxide layer.

15 Claims, 2 Drawing Sheets

METHOD OF FORMING GATE OXIDE LAYER IN SEMICONDUCTOR DEVICES

FIELD OF INVENTION

The present invention relates generally to an improved method of forming a gate oxide layer in a semiconductor device.

BACKGROUND OF THE INVENTION

In manufacturing semiconductor devices it is desirable if not required to remove pollutants from the surface of a semiconductor substrate prior to performing other surface treatment operations. Substrate surface pollution may be generated for example during manufacture processes. The failure to remove environmental substrate pollution typically reduces manufacturing yields and negatively affects the quality of the final semiconductor devices.

Such surface pollution on a semiconductor substrate can be generated by or result from any substrate manufacturing or processing step from the beginning up to and including completion of the manufacturing process. The sources of such substrate pollution are numerous, and may include particles, organics, metallic materials, oxide layers, such as a natural oxide of a substrate component, and many others. Because of the multiple sources of substrate pollution and the many possible types of pollutants, there is a limit to the completeness and effectiveness of prior art decontamination techniques.

At the same time, if a gate oxide layer is formed on a semiconductor substrate without such prior decontamination, the result will almost certainly be a defective semiconductor device or a device of less than optimal quality.

Furthermore, if a gate oxide layer is formed on a semiconductor substrate that has not been effectively treated for removal of pollutants, the resulting gate oxide layer has a tendency to be relatively and undesirably thin along at least some portion. As a result, functional ions which have been implanted into a gate electrode polysilicon structure formed over the gate oxide layer may permeate through an abnormally thin gate oxide layer and, perhaps, even permeate through the semiconductor substrate. Thus, an abnormally thin gate oxide layer resulting from a failure to remove pollutants from a substrate surface prior to forming the gate oxide layer is likely to result in a defect in the final semiconductor device.

SUMMARY OF THE INVENTION

According to an exemplary embodiment of the present invention, methods of forming a gate oxide layer in a semiconductor device in accordance with this invention can prevent or minimize defects of semiconductor devices, such methods at least including a step of performing a cleaning operation on semiconductor substrates prior to forming a gate oxide layer.

According to another exemplary embodiment of the present invention, methods of forming a gate oxide layer in a semiconductor device in accordance with this invention include a preliminary step or steps of performing a cleaning process for removing a natural oxide layer formed on a semiconductor substrate as well as for removing an oxide layer which is or may be generated by the removal of the natural oxide layer; a second step of performing a hydrogen annealing process to form a hydrogen passivation layer and for reducing surface roughness along the semiconductor substrate following the cleaning process; a third step of forming a gate oxide layer on the cleaned and passivated semiconductor substrate; a fourth step of performing a nitridation process on the gate oxide layer to further protect the semiconductor substrate from a permeation of deleterious ions; and a fifth step of performing a subsequent thermal treatment on the semiconductor device to stabilize a surface of the gate oxide layer.

In a preferred embodiment of this invention, an oxide layer generated by the removal of the natural oxide layer during the preliminary step of the methods is removed by using HF. In another preferred embodiment of the invention, the second step of the methods is performed through an annealing process carried out under the conditions of a temperature range between about 750° C. and about 1050° C., for a time of about 20 to 60 seconds, at a pressure in the range of about 0.1 to 100 torr and at a hydrogen or hydrogen-containing gas flow rate of about 0.5 SLM to 10 SLM. In another preferred embodiment of the invention, the nitride treatment process of the fourth step of the methods is used to form a nitride layer on the gate oxide layer formed on the substrate in step three or alternatively to form a nitrogen ion layer in the interior of the gate oxide layer. Such a nitrogen ion layer is desirably formed through a plasma nitridation process. In still another preferred embodiment of the invention, the second step of the methods is carried out by using deuterium ($D_2$) instead of $H_2$ in the hydrogen annealing process.

BRIEF DESCRIPTION OF THE DRAWINGS

The above features and advantages of the present invention as well as others will be better understood by the following detailed description, including exemplary embodiments thereof, with reference to the attached drawings in which.

DETAILED DESCRIPTION OF EXEMPLARY EMBODIMENTS

The present invention and exemplary embodiments thereof are more fully described below with reference to the accompanying drawings. This invention may, however, be embodied in many different forms and should not be construed as being limited to the exemplary embodiments set forth herein. Rather, these exemplary embodiments are provided so that this disclosure is thorough and complete, and conveys the concept of the invention to those skilled in the art.

Figure 1:
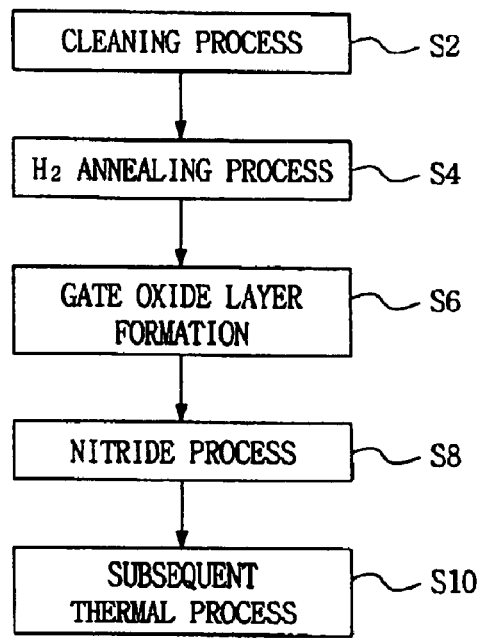
FIG. 1 is a flowchart generally illustrating methods of forming a gate oxide layer in a semiconductor device according to an embodiment of the present invention; and, FIGS. 2 through 5a and 5b are schematic illustrations of a semiconductor substrate having a gate oxide layer formed thereon according to the methods of the present invention.

FIG. 1 is a flowchart generally illustrating methods of forming a gate oxide layer in a semiconductor device according to an exemplary embodiment of the present invention.

FIGS. 2 through 5a and 5b are schematic illustrations of a semiconductor substrate having a gate oxide layer formed thereon according to the methods of the present invention.

Figure 2:
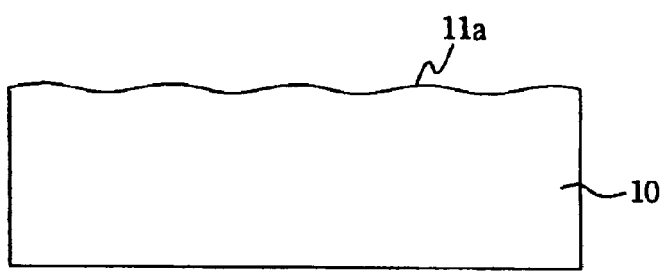
Figure 3:
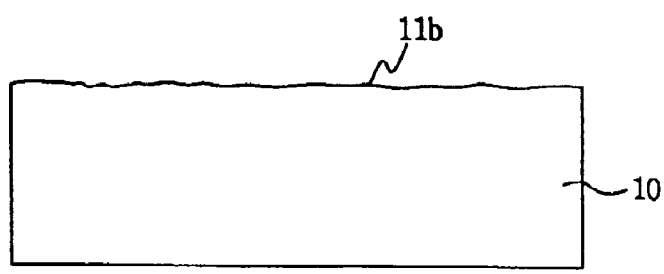

Referring first to a first or preliminary stage (S2) of FIG. 1 representing a substrate cleaning step or process, the cleaning process in accordance with this invention is carried out so as to remove a natural oxide layer which tends to form on a semiconductor substrate, for example substrate 10 as shown in FIG. 2. In a preferred embodiment of the present invention the natural oxide layer cleaning step (hereinafter referred to as an RCA cleaning) is performed on the substrate surface 11a before formation of a gate oxide layer. The RCA cleaning process may comprise both an acid-based cleaning step, typically utilizing sulfuric acid, (hereinafter referred to as an SPM cleaning step) and an alkaline-based cleaning step, typically utilizing ammonia/ammonium hydroxide, (hereinafter referred to as an SC-1 cleaning step), followed by an acidic treatment step using, for example, HF. Such a two-step preliminary RCA substrate cleaning process is preferred in applications where a substrate contains, or may contain, organic pollutant substances perhaps in combination with fine particulates. Thus, it has been found in accordance with this invention that if organic pollutants are among the ingredients of the natural oxide layer formed on a surface of a semiconductor wafer, a predominant portion of such organic pollutants are removed through an SPM cleaning step using, for example, an acidic cleaning solution consisting essentially of suitable proportions of sulfuric acid, hydrogen peroxide, and deionized water ($H_2SO_4$+ $H_2O_2$+DI). Organic pollutants remaining on the substrate among the ingredients of the natural oxide layer, and any remaining fine particles, can be effectively removed using an SC-1 cleaning step using, for example, a basic cleaning solution consisting essentially of suitable proportions of ammonium hydroxide, hydrogen peroxide, and deionized water ($NH_4OH$+$H_2O_2$+DI). For example, an SPM cleaning in accordance with this invention may be performed by mixing $H_2SO_4$ of about 98% (balance DI water) with $H_2O_2$ of about 30% in a volume ratio of about 2 to 4:1 and applying it to a substrate surface at a relatively high temperature above about 100° C. for a sufficient period of time to effect cleaning. Following such cleaning step, the sulfuric ingredient having a high viscosity must be sufficiently washed out and removed from the substrate surface by using de-ionized (DI) water. It has been found that, through such cleaning steps, organic impurities on the wafer surface are almost completely removed by this SPM cleaning step. Impurities remaining on the substrate surface following the SPM cleaning step can be removed by a subsequent SC-1 cleaning step, thereby completely removing the natural oxide layer.

During such SPM and SC-1 cleaning steps, the $H_2O_2$ ingredient contained in the SPM and SC-1 cleaning solutions may produce another chemical oxide layer on the wafer surface. Surface roughness resulting from the chemical oxide layer produced during such a cleaning procedure has a negative impact on the wafer characteristics comparable to, if not worse than, surface oxide layers generated by exposure to an oxygen-containing gas or an oxide layer produced thermally. Chemical materials used in the previously-described cleaning step(s), particularly metallic impurities in the $H_2O_2$, can cause metallic pollution on the wafer surface, which must then be substantially completely removed. Such additional problems caused by the SPM and SC-1 cleaning processes as described above can be addressed using a subsequent HF treatment process performed after completion of the RCA cleaning step(s).

Therefore, the first or preliminary stage S2 of FIG. 1, as schematically illustrated in FIG. 2, is executed not only to remove a natural oxide layer formed on the semiconductor substrate 10, but also to remove a chemical oxide layer that might be produced by the SPM and/or the SC-1 cleaning processes used to remove the natural oxide layer.

Next, a second step S4 of hydrogen annealing as illustrated in FIG. 1 is performed on the semiconductor substrate 10 following the RCA treatment process of step S2. The semiconductor substrate, as shown schematically in FIG. 3, following the RCA treatment process has bonds of non-combined silicon atoms on the surface 11b thereof, thus still causing a degree of surface roughness of about RMS 0361 (where RMS is understood to be the abbreviation for "Root Mean Square," a unit of measurement indicating a degree of surface roughness) or less that may be detected as fine windings or irregularities on the surface of the substrate. Although the surface roughness of surface 12 (FIG. 3) may be less than that of surface 11a (FIG. 2), as shown schematically in the drawings, such roughness is still greater than what would be required for optimal substrate performance. Accordingly, the semiconductor substrate having such a remaining degree of surface roughness is subjected to an $H_2$ annealing process under such process conditions as a temperature between about 750° C. and 1050° C. under a hydrogen atmosphere, for a time of about 20 to 60 seconds, at a pressure of about 0.1 to 100 torr, and at a flow rate of about 0.5 SLM to 10 SLM (where SLM is understood to be the abbreviation for "Standard Liter per Minute," a unit of measurement indicating the amount of a gas flowing per one minute, which is 1,000 times 1 sccm—standard cubic centimeter per minute). Once such a hydrogen annealing process (S4 of FIG. 1) is completed, a silicon substrate surface characterized by terminal hydrogen atoms is thereby obtained. These terminal surface hydrogen atoms not only serve as a hydrogen passivation layer formed along an entire working surface of the silicon substrate, but the $H_2$ annealing process also has the effect of further reducing surface roughness to a degree of about RMS 0176 or less by means of the combination of the hydrogen with the non-combined surface silicon atoms of the silicon substrate. Further, once the non-combined silicon atoms are, in effect, "capped" by annealing them with hydrogen atoms, abnormal growth of the oxide layer is minimized or entirely prevented during a subsequent process for growing a gate oxide layer on the substrate surface because of a lowered reaction susceptibility, even under conditions of a temperature increase needed to reach a desired gate oxide process temperature, thus effectively serving as a passivation layer for the silicon surface. When deuterium ($D_2$) is substituted in whole or in part for the hydrogen in the hydrogen annealing process, the same or better passivation effect can be obtained.

Therefore, in the second step S4 of FIG. 1, the hydrogen annealing process is performed on the cleaned substrate to form the hydrogen passivation layer along the semiconductor substrate surface and to improve the surface properties by further reducing the roughness of the semiconductor substrate surface.

Figure 4:
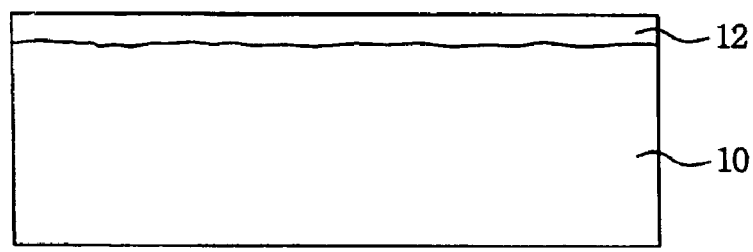

With reference to a third step S6 of FIG. 1, as schematically illustrated in FIG. 4, a gate oxide layer 12 is formed on the treated and passivated surface of semiconductor substrate 10 after completion of the hydrogen annealing process of step S4. The gate oxide layer 12 performs various functions, for example, not only protecting the semiconductor substrate as one element of the semiconductor device, but also providing an insulating layer between a subsequently-formed gate electrode and a source/drain region which is also subsequently formed on the semiconductor substrate. In order to satisfactorily perform these functions, the gate oxide layer is preferably formed with a predetermined thickness, for example by mainly using a thermal oxidation process. In alternative embodiments of this invention, depending on the sort of films to be subsequently formed on the oxide layer, a CVD method or a plasma oxidation method, etc., can be used appropriately.

Figure 5A:
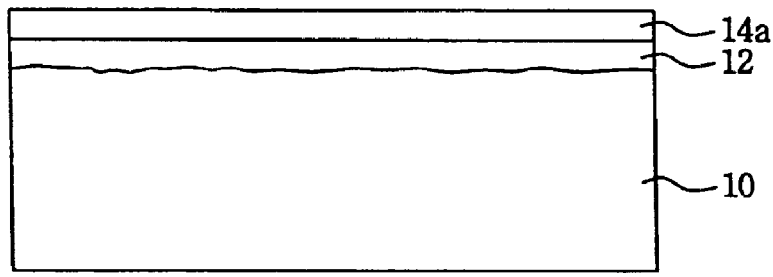
Figure 5B:
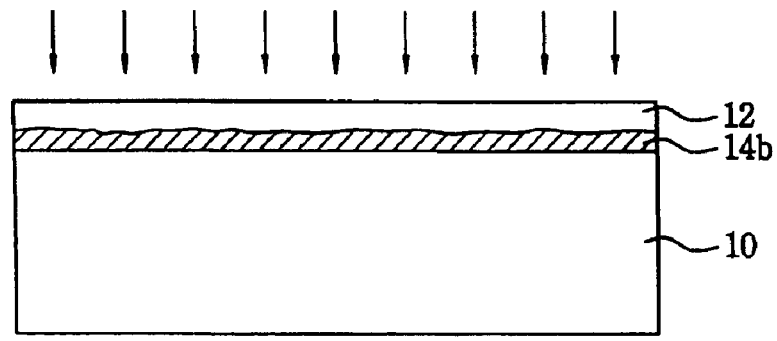

Referring next to a fourth step S8 of FIG. 1, as schematically illustrated in FIG. 5a or FIG. 5b, subsequent to the formation of gate oxide layer 12, such gate oxide layer is subjected to a nitride process to form a protective nitride layer 14a (FIG. 5a) on oxide layer 12 or, alternatively, to form a protective nitrogen ion layer 14b (FIG. 5b) between substrate 10 and oxide layer 12. The thickness of the gate oxide layer 12 formed on the semiconductor substrate 10 (from which the surface pollution was removed efficiently as described above), is gradually thinned, and such a thinned gate oxide layer may create a situation wherein the process of ion implantation used in forming a gate electrode (that is, ion implantation to dope a non-doped polysilicon electrode, or to increase a conductivity of polycrystalline silicon gate electrode, or for other common semiconductor applications) permeates through the gate oxide layer 12 and into the semiconductor substrate. Such ion permeation into the substrate impairs the quality and performance of the resulting semiconductor device. To prevent such a permeation, a nitride process as illustrated in either FIG. 5a or FIG. 5b is performed on the gate oxide layer 12. FIG. 5a illustrates a method of forming a protective, ion-impermeable silicon nitride (SiN) layer 14a on the thinned gate oxide layer 12. FIG. 5b illustrates a method of implanting nitrogen ions in the interior of the gate oxide layer 12 to thus form a protective, ion-permeable nitrogen ion layer 14b between substrate 10 and gate oxide layer 12.

First, the nitridation process using the method of forming an interior nitrogen ion layer 14b in gate oxide layer 12, as shown in FIG. 5b, will be described. Such a nitridation process can be carried out sequentially using a plasma nitridation process followed by a rapid thermal nitridation (RTN) process. The plasma nitridation process is a process which implants nitrogen by using a plasma nitridation apparatus which employs plasma and a chemical reaction, and in which various nitrogen-containing gases, e.g., NO gas, or $N_2O$ gas, etc., can be used as the reaction gas. A plasma formation source, an RF plasma nitridation process, a high-density plasma nitridation process, or a microwave nitridation process can be used in this part of the process. Furthermore, a remote plasma generating apparatus can be used to perform the nitridation process under such a state that the plasma generating apparatus is positioned a predetermined distance from a reaction chamber. In performing such a plasma nitridation process, the process parameters of reaction chamber pressure, power, temperature and length of time for using the plasma nitridation apparatus can be determined by routine experimentation based on considerations of a desired nitrogen content of the gate oxide layer 12 sufficient to resist ion permeation during a subsequent gate electrode forming step.

Next, the RTN process is used to complete the nitridation process using a rapid thermal process (RTP) under an atmosphere of ammonia ($NH_3$) or comparable gas, or in a furnace under an atmosphere of a gas that contains nitrogen, such as $N_2$, NO, $N_2O$, etc. The RTN process can be also performed using remote plasma nitridation, as discussed above. Such an RTN step is typically performed under a temperature between about 750° C. and 950° C.

An alternative method for preventing ions from permeating into the gate oxide layer 12 during a subsequent gate electrode forming step is to deposit a silicon nitride (SiN) layer 14a on the gate oxide layer 12, as shown in FIG. 5a. Such a silicon nitride layer 14a is desirably formed by any of the following methods: ALD (Atomic Layer Deposition), CVD (Chemical Vapor Deposition), JVD (Jet Vapor Deposition), PVD (Plasma-enhanced Vapor Deposition), or by a thermal process.

Accordingly, ion permeation to the semiconductor substrate 10 during a subsequent gate electrode forming step can be substantially reduced or effectively prevented by carrying out at least one of the two nitridation process steps of the fourth step (S8) of FIG. 1. Referring finally to the fifth step (S10) of FIG. 1, a subsequent thermal process is performed on the nitridation-processed gate oxide layer. The surface of the nitridation-processed gate oxide layer 12 can be partially destabilized by the nitridation process step (S8) described above, resulting in undesirable changes in the performance of a final semiconductor device and/or reducing the useful life of the device. To prevent such changes or short life of the device, a subsequent thermal process is performed on the gate oxide layer 12 following the nitridation step. This subsequent thermal process is preferably performed using a RTP. as used in step (S8) or using the furnace under a gas atmosphere of $N_2$, $O_2$, $N_2O$, $O_2$, $O_2+H_2$, $N_2O+H_2$, etc. Such a subsequent thermal process has been found to stabilize the surface of the gate oxide layer 12 by a mechanism that is believed to involve the re-combination of surplus nitrogen ions, or by a combination with oxygen, to prevent the characteristic change and/or life shortening of the device experienced in the absence of such a thermal treatment.

As described above, the present invention involves s series of sequential steps for treating a semiconductor substrate whereby: (a) a natural oxide layer formed on a semiconductor substrate is removed; (b)a hydrogen annealing process is performed on the surface of the semiconductor substrate from which the natural oxide layer was removed, to thus form a passivation layer so that a surface roughness of the semiconductor substrate may be improved; (c) a gate oxide layer is formed on the substrate surface; (d) the gate oxide layer is subjected to a nitridation process to prevent the semiconductor substrate from ion permeation during a subsequent gate electrode forming step; and, (e) the nitridation-processed gate oxide layer is subjected to a final thermal treatment.

The gate oxide layer is formed on a semiconductor substrate surface which has been significantly improved in the degree of surface roughness through a hydrogen annealing process, and this gate oxide layer is then nitridation processed, thereby further improving the defect rate of the device.

Semiconductor devices formed in accordance with this invention therefore also have an advantage of a reduced defect rate in the formation of a more uniform and adherent gate oxide layer, and also improved ion permeation resistance from the nitridation process performed on the gate oxide layer that was improved for substrate surface roughness through the cleaning and hydrogen annealing processes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of processing a semiconductor substrate to form an improved semiconductor device, said method comprising the sequential method steps of:

a first method step of performing a two-stage cleaning process comprising: (i) removing a natural oxide layer formed on said semiconductor substrate; and, (ii) thereafter removing an oxide layer generated by the step of removing the natural oxide layer to produce a cleaned substrate surface;

a second method step of subjecting the cleaned substrate surface to a hydrogen annealing process to form a hydrogen passivation layer and for further reducing the roughness of the cleaned substrate surface;

a third method step of forming a gate oxide layer on the cleaned hydrogen-annealed substrate surface;

a fourth method step of performing a nitridation process on the gate oxide layer formed on the cleaned, hydrogen-annealed substrate surface to reduce the susceptibility of the semiconductor substrate to ion permeation during a later gate electrode forming step; and, a fifth method step of performing a subsequent thermal process on the nitridation-processed gate oxide layer to stabilize a surface of the gate oxide layer.

2. The method of claim 1, further wherein the oxide layer generated in removing the natural oxide layer in the first stage (i) of the first method step is removed in the second stage (ii) by using HF.

3. The method of claim 1, further wherein the second method step is performed using a thermal process under process conditions of a temperature between about 750° C. and 1050° C., a time of about 20 to 60 seconds, at a pressure between about 0.1 and 100 torr, and at a flow rate of about 0.5 SLM to 10 SLM.

4. The method of claim 1, further wherein the nitridation process of the fourth method step forms a protective, ion-impermeable nitride layer on the gate oxide layer.

5. The method of claim 1, further wherein the nitridation process of the fourth method step forms a protective, ion-impermeable nitrogen ion layer in the interior of the gate oxide layer.

6. The method of claim 5, wherein the nitrogen ion layer is formed through a plasma nitridation process.

7. The method of claim 1, further wherein the second method step is performed using deuterium ($D_2$) instead of $H_2$ in the hydrogen annealing process.

8. An improved semiconductor substrate prepared by a process comprising the sequential steps of:

(a) treating a surface of a semiconductor substrate at least for removal of a natural oxide layer on said surface to form at least a partially-cleaned substrate surface;

(b) performing a hydrogen annealing step on the at least partially-cleaned substrate surface formed in step (a);

(c) depositing a gate oxide layer on the hydrogen-annealed substrate surface formed in step (b);

(d) subjecting the gate oxide layer of the substrate as formed in step (c) to a nitridation process; and, (e) thermally treating the nitridation-processed gate oxide layer formed in step (d) to form the improved semiconductor substrate.

9. An improved semiconductor substrate according to claim 8 wherein the surface treatment of step (a) includes the step of treating the surface with an acidic cleaning solution consisting essentially of sulfuric acid, hydrogen peroxide, and deionized water in suitable proportions.

10. An improved semiconductor substrate according to claim 8 wherein the process of preparing the substrate further comprises a second surface treatment step carried out between steps (a) and (b) for removal of remaining organic pollutants, fine particles, and/or an oxide layer formed during step (a).

11. An improved semiconductor substrate according to claim 10 wherein said second surface treatment includes the step of treating the at least partially-cleaned substrate surface formed in step (a) with a basic cleaning solution consisting essentially of ammonium hydroxide, hydrogen peroxide, and deionized water in suitable proportions.

12. An improved semiconductor device comprising a semiconductor substrate having a gate electrode formed thereon according to the process of:

(a) treating a surface of a semiconductor substrate at least for removal of a natural oxide layer on said surface to form at least a partially-cleaned substrate surface;

(b) performing a hydrogen annealing step on the at least partially-cleaned substrate surface formed step (a);

(c) depositing a gate oxide layer on the hydrogen-annealed substrate surface formed in step (b);

(d) subjecting the gate oxide layer of the substrate as formed in step (c) to a nitridation process; and, (e) thermally treating the nitridation-processed gate oxide layer formed in step (d) to form the improved semiconductor substrate; and, (f) forming a gate electrode on the thermally-treated, nitridation-processed gate oxide layer formed in step (e) to form the semiconductor substrate having a gate electrode.

13. An improved semiconductor device according to claim 12 wherein the surface treatment of step (a) includes the step of treating the surface with an acidic cleaning solution consisting essentially of sulfuric acid, hydrogen peroxide, and deionized water in suitable proportions.

14. An improved semiconductor device according to claim 12 wherein the process of preparing the substrate further comprises a second surface treatment step carried out between steps (a) and (b) for removal of remaining organic pollutants, fine particles, and/or an oxide layer formed during step (a).

15. An improved semiconductor device according to claim 14 wherein said second surface treatment includes the step of treating the at least partially-cleaned substrate surface formed in step (a) with a basic cleaning solution consisting essentially of ammonium hydroxide, hydrogen peroxide, and deionized water in suitable proportions.

* * * * *